(12) United States Patent  
Watanabe et al.

(10) Patent No.: US 9,293,764 B2  
(45) Date of Patent: Mar. 22, 2016

(54) NEGATIVE ELECTRODE ACTIVE MATERIAL FOR ELECTRIC DEVICE, NEGATIVE ELECTRODE FOR ELECTRIC DEVICE AND ELECTRIC DEVICE

(75) Inventors: Manabu Watanabe, Yokosuka (JP); Masao Yoshida, Zushi (JP)

(73) Assignee: NISSAN MOTOR CO., LTD., Yokohama-shi (JP)

( * ) Notice: Subject to any disclaimer, the term of this patent is extended or adjusted under 35 U.S.C. 154(b) by 0 days.

(21) Appl. No.: 14/119,034

(22) PCT Filed: May 22, 2012

(86) PCT No.: PCT/JP2012/063056  
§ 371 (c)(1),  
(2), (4) Date: Nov. 20, 2013

(87) PCT Pub. No.: WO2012/161190  
PCT Pub. Date: Nov. 29, 2012

(65) Prior Publication Data  
US 2014/0086788 A1  Mar. 27, 2014

(30) Foreign Application Priority Data  
May 25, 2011  (JP) .................... 2011-116710

(51) Int. Cl.  
*H01M 4/38* (2006.01)  
*C23C 14/06* (2006.01)  
(Continued)

(52) U.S. Cl.  
CPC ............. *H01M 4/38* (2013.01); *C22C 14/00* (2013.01); *C22C 28/00* (2013.01); *C22C 45/00* (2013.01);  
(Continued)

(58) Field of Classification Search  
CPC ..................................... C23C 14/06

USPC .................................................... 420/417  
See application file for complete search history.

(56) References Cited

U.S. PATENT DOCUMENTS 3,813,759 A * 6/1974 Heap et al. ............. 228/121  
5,644,166 A * 7/1997 Honeycutt et al. ........... 257/754  
(Continued)

FOREIGN PATENT DOCUMENTS

JP  2000-133261 A  5/2000  
JP  2007-19027 A  1/2007  
(Continued)

OTHER PUBLICATIONS

Lai and Chen, Effects of composition on the formation temperatures and electrical resistivities of C54 titanium, Journal of Applied Physics, 00218979, Aug. 1, 1999, vol. 86, Issue 3 pp. 1340-1345 (hereinafter "Lai").*

(Continued)

*Primary Examiner* — Jessee Roe  
*Assistant Examiner* — Christopher Kessler  
(74) *Attorney, Agent, or Firm* — Foley & Lardner LLP

(57) ABSTRACT

A negative electrode active material for an electric device includes an alloy containing Si in a range from greater than or equal to 17% by mass to less than 90% by mass, Ti in a range from 10% by mass to 83% by mass exclusive, Ge in a range from 0% by mass to 73% by mass exclusive, and inevitable impurities as a residue. The negative electrode active material can be obtained with a multi DC magnetron sputtering apparatus by use of, for example, Si, Ti and Ge as targets. An electric device employing the negative electrode active material can achieve long cycle life, and ensure a high capacity and improved cycle durability.

16 Claims, 6 Drawing Sheets

(51) Int. Cl.
*C22C 14/00* (2006.01)
*C22C 28/00* (2006.01)
*C22C 45/00* (2006.01)
*C22C 45/10* (2006.01)
*H01M 10/052* (2010.01)

(52) U.S. Cl.
CPC .............. *C22C 45/10* (2013.01); *C23C 14/06* (2013.01); *H01M 4/386* (2013.01); *H01M 10/052* (2013.01); *Y02T 10/7011* (2013.01)

(56) References Cited

U.S. PATENT DOCUMENTS

| | | | |
|---|---|---|---|
| 6,265,111 | B1 | 7/2001 | Bito et al. |
| 6,730,434 | B1 | 5/2004 | Kawakami et al. |
| 6,949,312 | B1 | 9/2005 | Kawakami et al. |
| 2005/0175901 | A1 | 8/2005 | Kawakami et al. |
| 2007/0031730 | A1 | 2/2007 | Kawakami et al. |
| 2007/0037063 | A1 | 2/2007 | Choi et al. |
| 2012/0052388 | A1* | 3/2012 | Jung .................. C22C 1/10 429/218.1 |

FOREIGN PATENT DOCUMENTS

| | | |
|---|---|---|
| JP | 2007-305424 A | 11/2007 |
| WO | WO 00/17949 A1 | 3/2000 |
| WO | WO 2011/059251 A2 | 5/2011 |

OTHER PUBLICATIONS

Korean Office Action, Aug. 6, 2014, 4 pages.

* cited by examiner

NEGATIVE ELECTRODE ACTIVE MATERIAL FOR ELECTRIC DEVICE, NEGATIVE ELECTRODE FOR ELECTRIC DEVICE AND ELECTRIC DEVICE

TECHNICAL FIELD

The present invention relates to a negative electrode active material for an electric device generally serving as a secondary battery or a capacitor preferably used as a driving power source of a motor for use in, for example, an electric vehicle (EV) or a hybrid electric vehicle (HEV). The present invention also relates to a negative electrode, an electric device and a lithium ion secondary battery using the negative electrode active material.

BACKGROUND ART

Various measures for reduction of emissions of $CO_2$ are being taken in order to deal with atmospheric pollution and global warming. In particular, in the automobile industry, the reduction of emissions of $CO_2$ is highly expected in association with the spread of electric vehicles and hybrid electric vehicles. Thus, development of high-performance secondary batteries serving as driving power sources of motors for use in such vehicles, is actively being carried out. Since a higher capacity and cycle property are particularly required for the secondary batteries for driving motors, lithium ion secondary batteries having high theoretical energy are gaining increasing attention among other types of secondary batteries.

The lithium ion secondary batteries are required to store a large amount of electricity in positive electrodes and negative electrodes by unit mass, in order to increase energy density of the lithium ion secondary batteries. The lithium ion secondary batteries highly depend on active materials used in the respective electrodes to fulfill such a requirement.

As one of measures to improve performance of lithium ion secondary batteries, there is known a negative electrode active material capable of ensuring a high capacity and releasing stress caused by expansion and contraction, and a battery using such a negative electrode active material, as proposed in Patent Literature 1. The negative electrode active material contains Si as a first element, Ge as a second element, and at least one of Ti, V, Cr, Mn, Fe, Co, Ni, Cu, Zn and Nb as a third element. Patent Literature 1 discloses that the content of Ge is in the range from 5 to 12 atom %, and the content of the third element is in the range from 0.5 to 10 atom %, with respect to the content of Si.

CITATION LIST

Patent Literature

Patent Literature 1: Japanese Unexamined Patent Application Publication No. 2007-305424

SUMMARY OF INVENTION

However, the lithium ion secondary battery using the negative electrode active material disclosed in Patent Literature 1 shifts from an amorphous state to a crystalline state when Si is alloyed with Li. As a result, the volume is greatly changed, which causes a reduction in cycle life of the electrode. In addition, in the case of using the Si active material, the capacity of the lithium ion secondary battery has a trade-off relationship with cycle durability. Thus, the lithium ion secondary battery is highly required to ensure a higher capacity and improved durability concurrently.

The present invention has been accomplished in view of the problem in conventional negative electrode active materials. An object of the present invention is to provide a negative electrode active material for an electric device such as a lithium ion secondary battery capable of suppressing amorphous-crystal phase transition so as to extend cycle life while ensuring a high capacity. Another object of the present invention is to provide a negative electrode including the negative electrode active material, and an electric device such as a lithium ion secondary battery using the negative electrode including the negative electrode active material.

A negative electrode active material for an electric device according to an aspect of the present invention includes an alloy containing Si in a range from greater than or equal to 17% by mass to less than 90% by mass, Ti in a range from 10% by mass to 83% by mass exclusive, Ge in a range from 0% by mass to 73% by mass exclusive, and inevitable impurities as a residue. A negative electrode for an electric device according to the present invention includes the negative electrode active material according to the present invention. An electric device according to the present invention includes the negative electrode active material according to the present invention or the negative electrode according to the present invention. A lithium ion secondary battery may be a representative example of the electric device according to the present invention.

DESCRIPTION OF EMBODIMENTS

Figure 1:
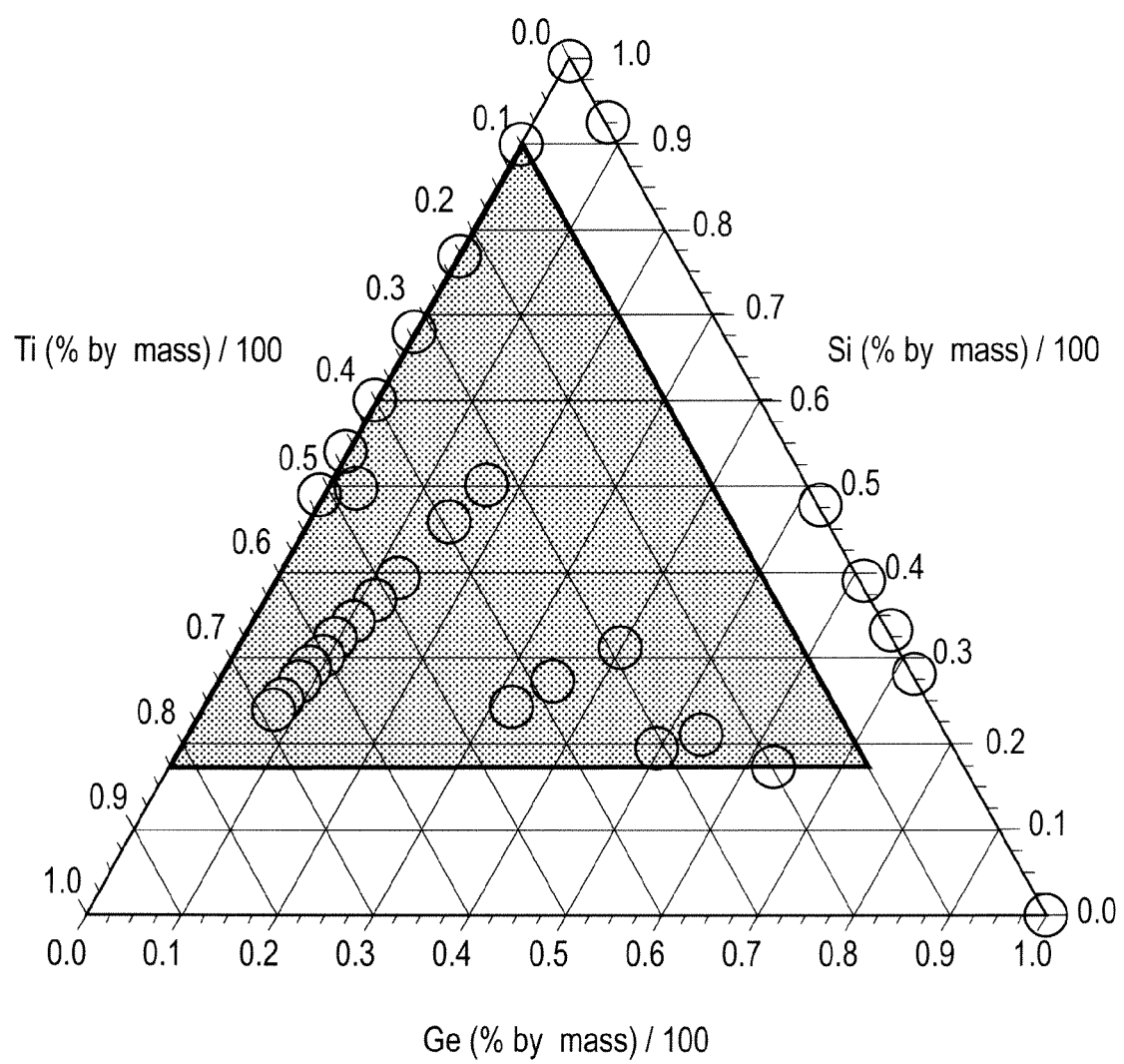
FIG. 1 is a ternary composition diagram showing a composition range of an Si—Ge—Ti series alloy included in a negative electrode active material for an electric device according to the present invention, wherein alloy compositions prepared in each example are plotted.

Hereinafter, a negative electrode active material for an electric device will be explained in detail while exemplifying a negative electrode for a lithium ion secondary battery and a lithium ion secondary battery using the negative electrode active material. It should be noted that the symbol "%" represents a percentage by mass unless otherwise specified. In addition, dimensional ratios in the drawings are magnified for convenience of explanation and may be different from actual ratios.

[Negative Electrode Active Material for Electric Device]

The negative electrode active material for a lithium ion secondary battery according to an embodiment of the present invention will be explained in detail below.

The negative electrode active material according to the present invention includes, as described above, an alloy containing Si with content in the range from greater than or equal to 17% by mass to less than 90% by mass, Ti with content in the range from 10% by mass to 83% by mass exclusive, Ge with content in the range from 0% by mass to 73% by mass exclusive, and inevitable impurities as a residue. These numerical ranges correspond to the shaded area indicated in FIG. 1.

This negative electrode active material is used in a negative electrode for an electric device such as a lithium ion secondary battery. In this case, an alloy contained in the negative electrode active material absorbs lithium ions when the battery is charged, and releases the lithium ions when the battery is discharged. The negative electrode active material contains Ge as a first additive element and Ti as a second additive element that suppress amorphous-crystal phase transition so as to extend cycle life when the negative electrode active material is alloyed with lithium by charging. These additives contribute to ensuring a higher capacity than conventional negative electrode active materials, in particular, carbon series negative electrode active materials. By optimizing the composition ranges of Ge and Ti as first and second additive elements, the Si—Ge—Ti series negative electrode active material according to the present invention not only can ensure a high capacity but also can keep a high discharge capacity even after 50 cycles or 100 cycles. Namely, the negative electrode active material containing the Si—Ge—Ti series alloy with long cycle life can be obtained.

In the negative electrode active material containing the Si—Ge—Ti series alloy according the present invention, If the content of Si is less than 17% by mass, the initial capacity of the battery tends to be decreased. In addition, if the content of Ti is 10% by mass or less, the cycle life tends to be shortened.

Figure 2:
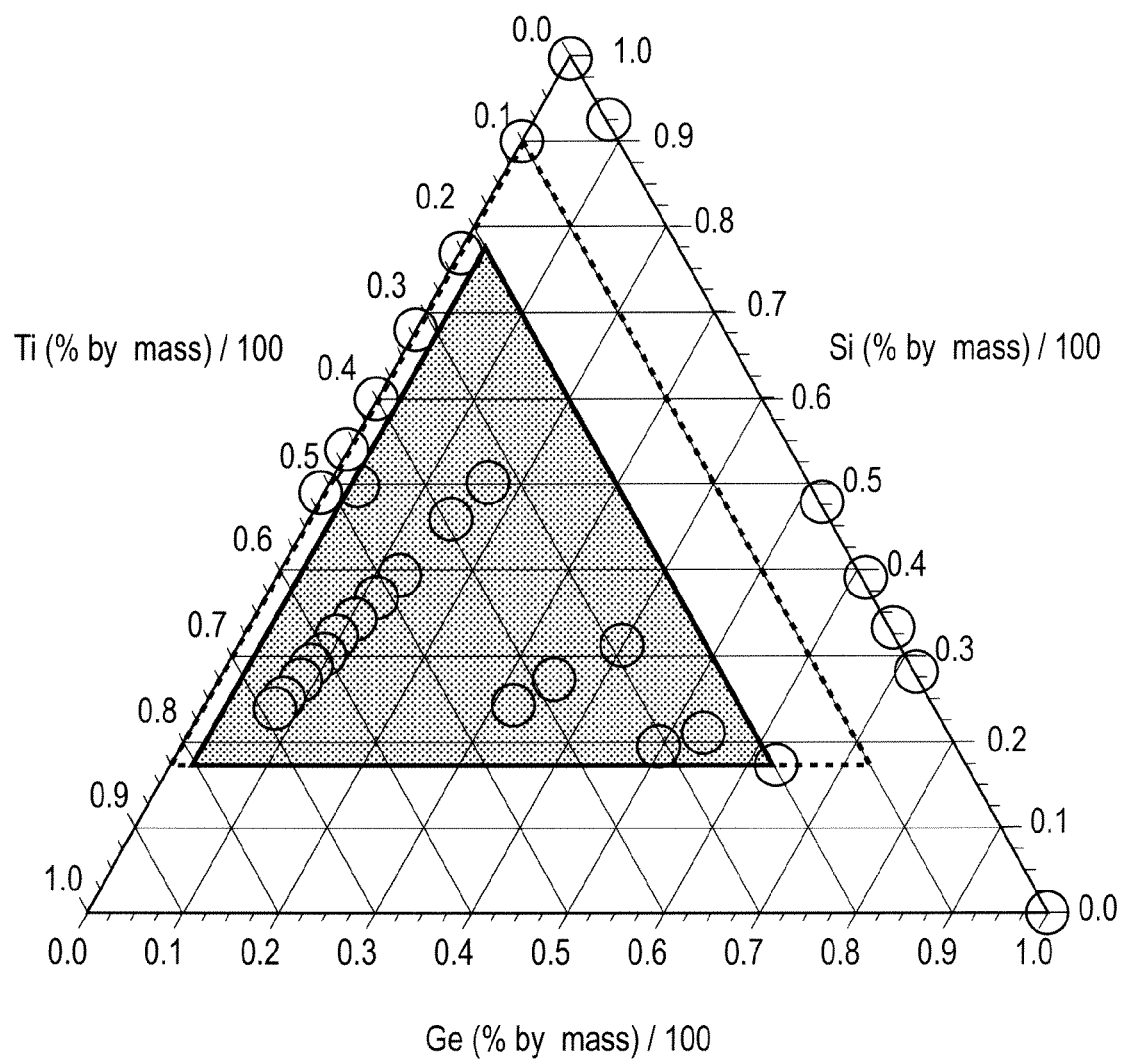
FIG. 2 is a ternary composition diagram showing a preferable composition range of the Si—Ge—Ti series alloy included in the negative electrode active material for an electric device according to the present invention.
Figure 3:
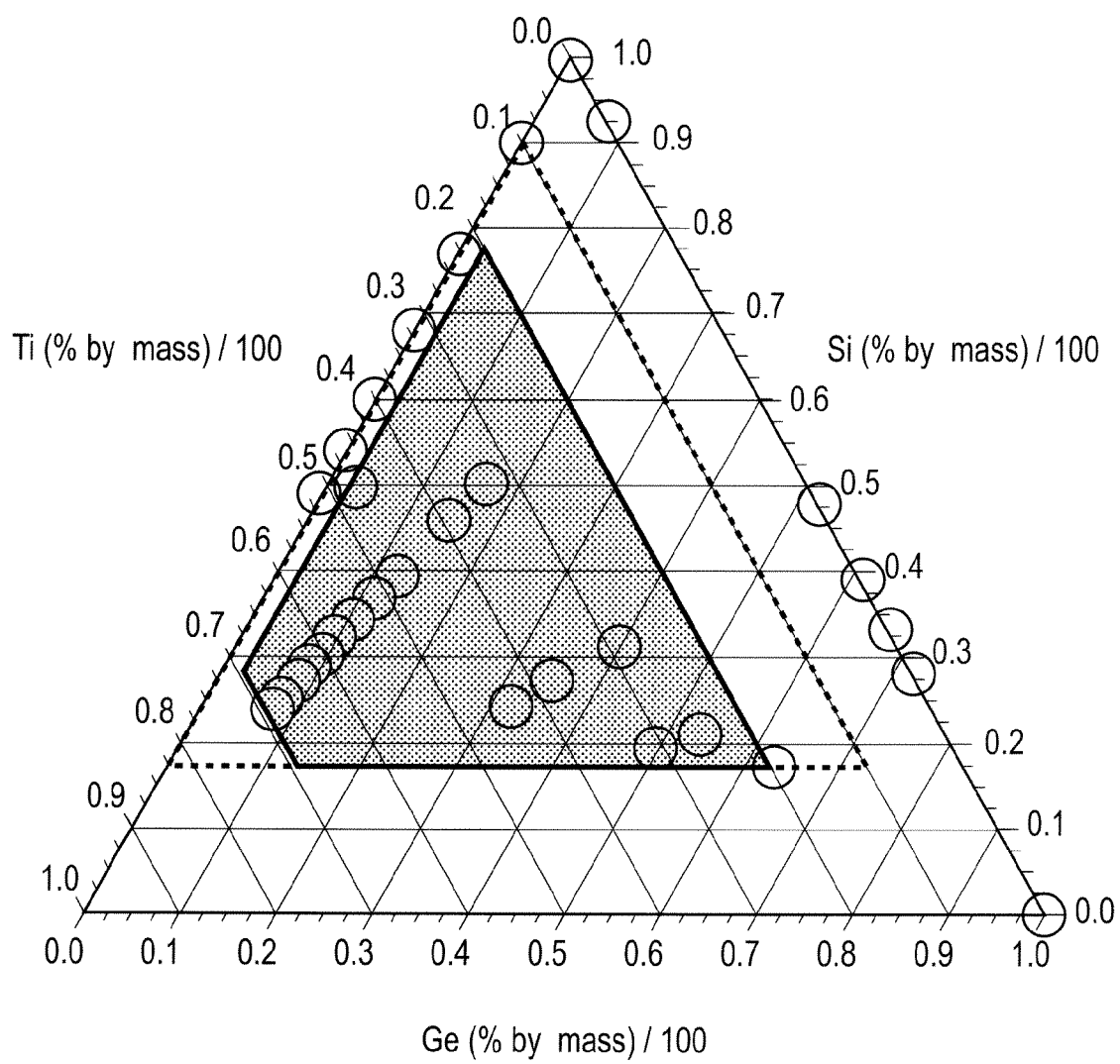
FIG. 3 is a ternary composition diagram showing a more preferable composition range of the Si—Ge—Ti series alloy included in the negative electrode active material for an electric device according to the present invention.
Figure 4:
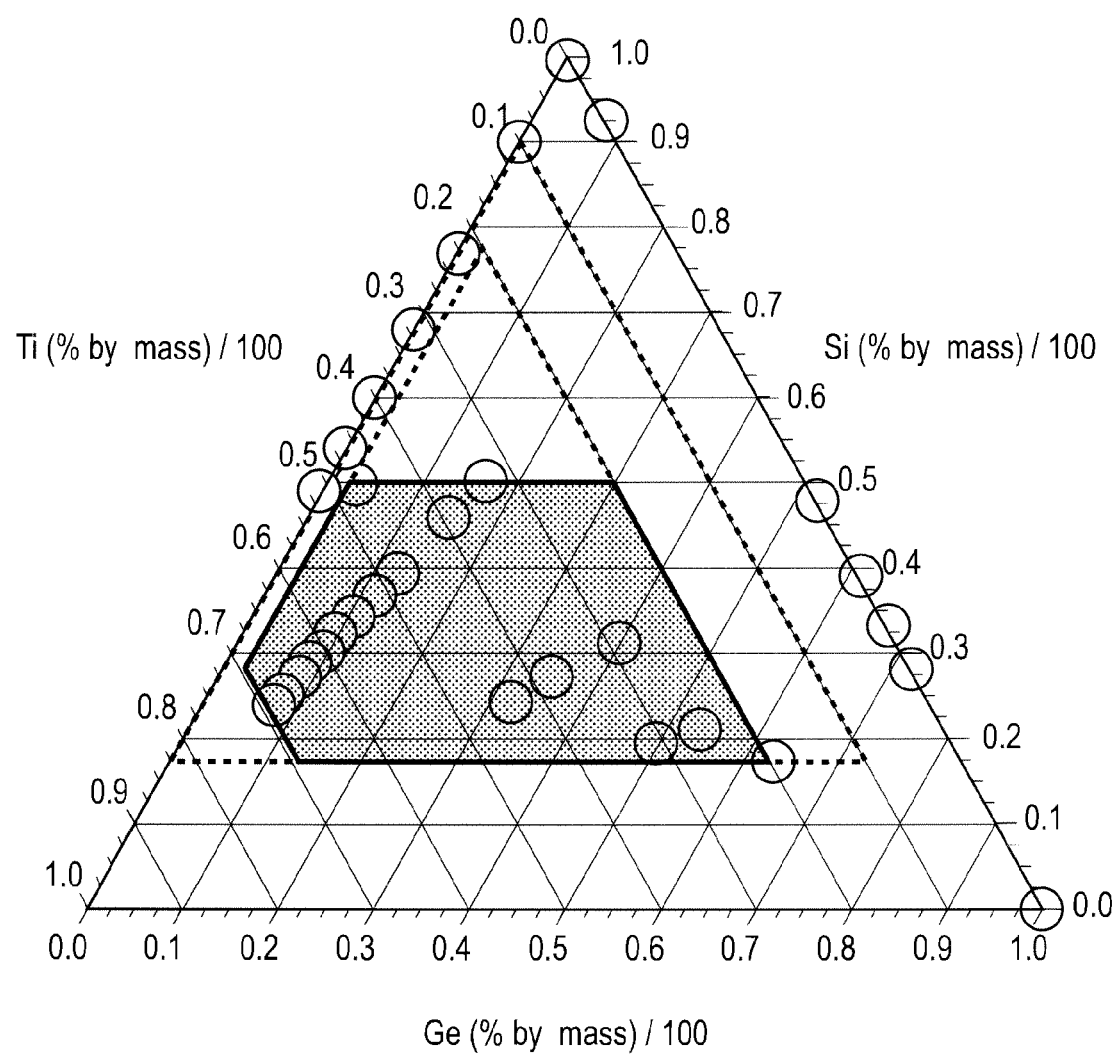
FIG. 4 is a ternary composition diagram showing a still more preferable composition range of the Si—Ge—Ti series alloy included in the negative electrode active material for an electric device according to the present invention.
Figure 5:
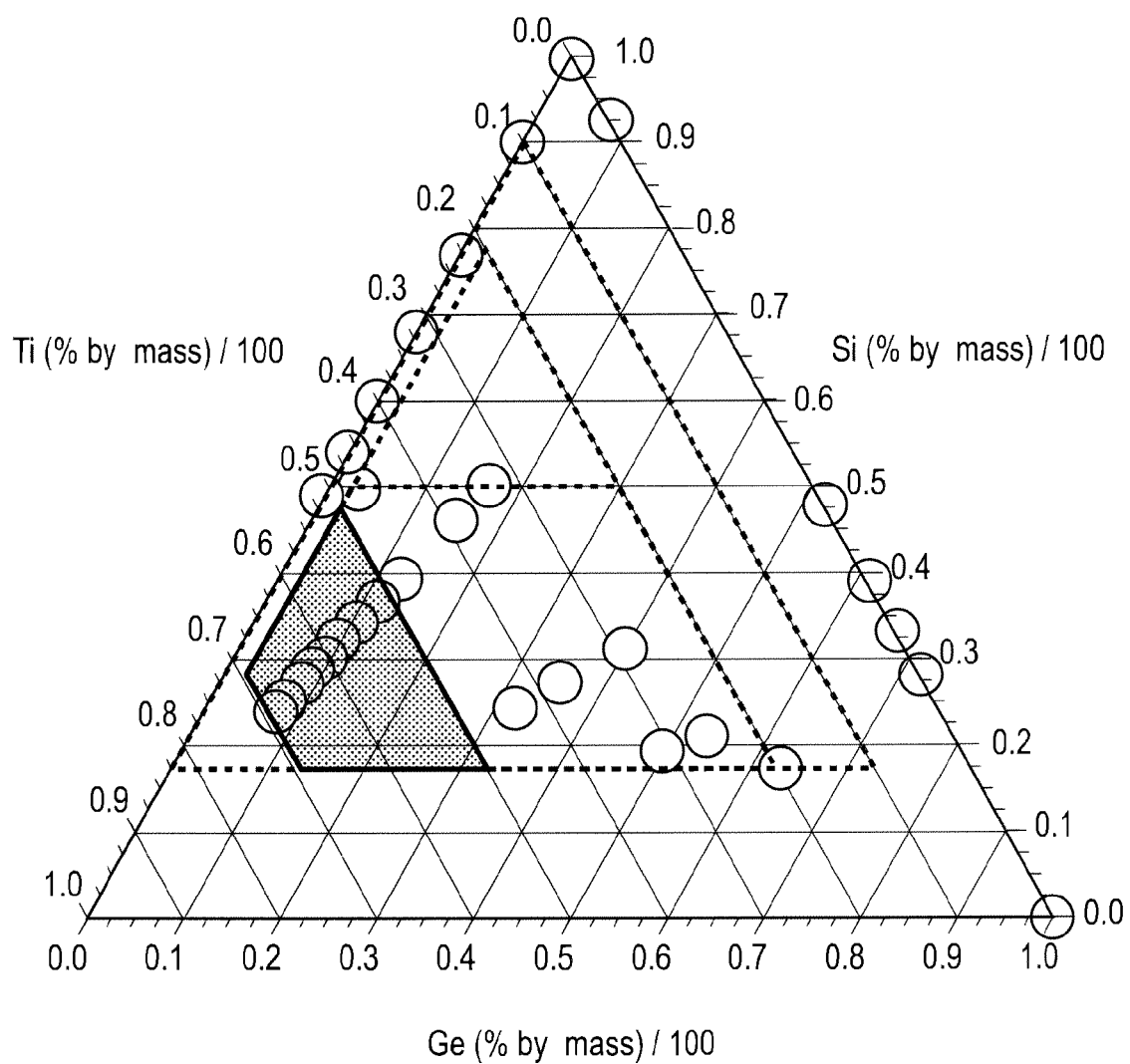
FIG. 5 is a ternary composition diagram showing the most preferable composition range of the Si—Ge—Ti series alloy included in the negative electrode active material for an electric device according to the present invention.

In order to improve these properties, the alloy preferably contains Si with content in the range from 17% by mass to 77% by mass, Ge with content in the range from 3% by mass to 63% by mass, and Ti with content in the range from 20% by mass to 80% by mass as shown in the shaded area of FIG. 2. The alloy more preferably contains Ti with content of 68% by mass or less as shown in the shaded area of FIG. 3. The alloy still more preferably contains Si with content of 50% by mass or less as shown in the shaded area of FIG. 4. The alloy most preferably contains Ti with content of 51% by mass or greater as shown in the shaded area of FIG. 5.

Note that the negative electrode active material according to the present invention inevitably contains impurities derived from the raw materials and the production method, in addition to the three compositions described above. The content of the inevitable impurities is preferably less than 0.5% by mass, more preferably less than 0.1% by mass.

As described above, the alloy included in the negative electrode active material according to the present embodiment contains Si with content in the range from greater than or equal to 17% by mass to less than 90% by mass, Ti with content in the range from 10% by mass to 83% by mass exclusive, Ge with content in the range from 0% by mass to 73% by mass exclusive, and inevitable impurities as a residue. Namely, the alloy is composed only of Si with content in the range from greater than or equal to 17% by mass to less than 90% by mass, Ti with content in the range from 10% by mass to 83% by mass exclusive, Ge with content in the range from 0% by mass to 73% by mass exclusive, and inevitable impurities as a residue.

The method for manufacturing the negative electrode active material of the present invention, that is, the Si—Ge—Ti series alloy having the above-described composition, is not particularly limited, and may be any conventionally known method. That is, various manufacturing methods may be used without any particular obstacle, since there is little difference in the conditions and characteristics of the alloy produced by the manufacturing methods.

Specific examples of the method for manufacturing the thin film alloy having the above-described composition include a multi PVD method (a sputtering method, a resistance heating method, a laser ablation method), and a multi CVD method (a chemical vapor-phase growth method). Examples of the multi PVD method include a sputtering method, a resistance heating method and a laser ablation method. The multi CVD method may be a chemical vapor-phase growth method. These manufacturing methods can provide the negative electrode in a manner such that the alloyed thin film is directly formed on a current collector. Thus, these manufacturing methods contribute to simplification of the process. In addition, these manufacturing methods need not use other components composing a negative electrode active material layer, such as a binder and an electric conducting additive, other than the alloy and therefore, the alloyed thin film as the negative electrode active material is simply used for the negative electrode. Accordingly, these manufacturing methods contribute to a higher capacity and energy density, which satisfy the level suitable for practical use in vehicles, and are desirable to examine electrochemical characteristics of the active material.

The method for manufacturing the alloyed thin film may use a multi DC magnetron sputtering apparatus, such as an independently controllable ternary DC magnetron sputtering apparatus. Such an apparatus can freely form the Si—Ge—Ti series alloyed thin film having various alloy compositions and thicknesses, on the surface of the substrate (the current collector). For example, the ternary DC magnetron sputtering apparatus uses target 1 (Si), target 2 (Ge) and target 3 (Ti), fixes the sputtering time, and changes the power level of the DC power source to 185 W for Si, in the range from 0 to 120 W for Ge, and in the range from 0 to 150 W for Ti. Accordingly, ternary series alloy samples having various composition formulae can be obtained. Note that, since sputtering conditions depend on sputtering devices, it is preferable to estimate appropriate ranges of the sputtering conditions through preliminary tests for each sputtering device.

As described above, the negative electrode active material layer according to the present embodiment can use the Si—Ge—Ti series alloyed thin film. Alternatively, the negative electrode active material layer may be a layer containing particles of the Si—Ge—Ti series alloy as a main component. Examples of the method for manufacturing such an alloy in a particle state having the composition described above include a mechanical alloying method and an arc plasma melting method. When the alloy in the particle state is used as the negative electrode active material, slurry is prepared first in a manner such that a binder, an electric conducting additive and a viscosity control solvent are added to the alloy particles. The slurry thus obtained is then applied to the current collector to form the negative electrode active material layer, so as to obtain the negative electrode. Such a process is superior in terms of mass production and practicality for actual battery electrodes.

When the alloy in the particle state is used as the negative electrode active material, the average particle diameter of the alloy is not particularly limited as long as it is substantially the same as that of conventional negative electrode active materials. Here, the average particle diameter is preferably in the range from 1 μm to 20 μm in view of higher output power, however, the average particle diameter may be in other ranges as long as it can achieve the effects described above appropriately.

Note that, in the description of the present invention, "the particle diameter" represents the greatest length between any two points on the circumference of the active material particle (the observed plane) observed by observation means such as a scanning electron microscope (SEM) or a transmission electron microscope (TEM). In addition, "the average particle diameter" represents a value calculated with the scanning electron microscope (SEM) or the transmission electron microscope (TEM) as an average value of particle diameters of the particles observed in several to several tens of fields of view. Particle diameters and average particle diameters of other constituents may be determined in the same manner.

[Negative Electrode for Electric Device and Electric Device]

The negative electrode for an electric device according to the present invention includes the negative electrode active material containing the Si—Ge—Ti series alloy. The lithium ion secondary battery as a representative example of the electric device includes at least one single cell including the negative electrode in which the negative electrode active material layers containing the negative electrode active material are provided on both sides of the current collector, the single cell further including an electrolyte layer and a positive electrode. Hereinafter, the constitution of the lithium ion secondary battery and the materials used therein will be explained in detail.

(Constitution of Lithium Ion Secondary Battery)

Figure 6:
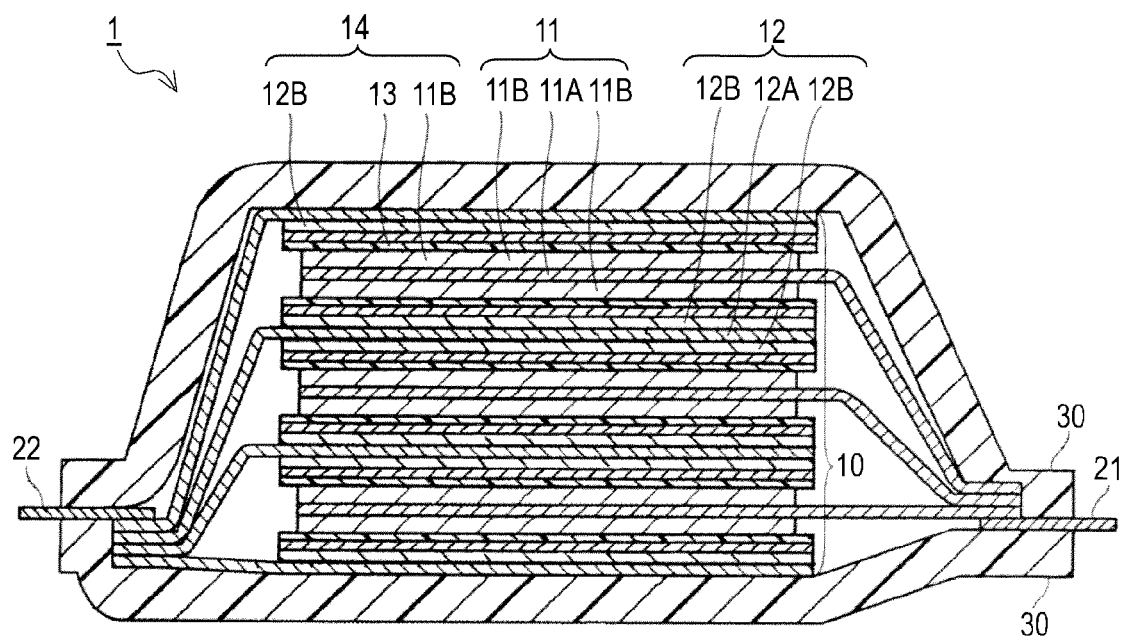
FIG. 6 is a schematic cross-sectional view showing an example of a lithium ion secondary battery according to an embodiment of the present invention.

FIG. 6 shows an example of the lithium ion secondary battery according to an embodiment of the present invention. As shown in FIG. 6, the lithium ion secondary battery 1 according to the present embodiment has a constitution in which a battery element 10 to which a positive electrode tab 21 and a negative electrode tab 22 are attached, is sealed in an exterior body 30. In the present embodiment, the positive electrode tab 21 and the negative electrode tab 22 are exposed on opposite sides on the outside of the exterior body 30. Note that the positive electrode tab and the negative electrode tab may be exposed on the same side on the outside of the exterior body (not shown in the figure). In addition, the positive electrode tab and the negative electrode tab may be attached to positive electrode current collectors and negative electrode current collectors which will be described below by, for example, ultrasonic welding or resistance welding.

(Positive Electrode Tab and Negative Electrode Tab)

The positive electrode tab 21 and the negative electrode tab 22 are made from a material such as aluminum (Al), copper (Cu), titanium (Ti), nickel (Ni), stainless steel (SUS), or an alloy thereof. However, the material is not limited to these, and may be any conventionally known material used for tabs for lithium ion secondary batteries. The positive electrode tab and the negative electrode tab may be made from the same material, or may be made from different materials. The tabs may be prepared preliminarily and connected to the positive electrode current collectors and the negative electrode current collectors which will be described below, according to the present embodiment. Alternatively, each of the positive electrode current collectors and the negative electrode current collectors which will be described below may be extended to form the respective tabs when these are in a foil state.

[Exterior Body]

The exterior body 30 is preferably made from a film-like exterior material in view of, for example, reduction in size and weight. However, the exterior body 30 is not limited to such a material, and may be any conventionally known material available for exterior bodies for lithium ion secondary batteries. When the lithium ion secondary battery is used for a vehicle, a polymer-metal composite laminated sheet hiving high thermal conductivity is preferably used in order to transfer heat efficiently from a heat source the vehicle and rapidly heat the inside of the battery to a battery operation temperature.

(Battery Element)

As shown in FIG. 6, the battery element 10 in the lithium ion secondary battery 1 according to the present embodiment includes plural single cell layers 14 stacked on top of each other, each including a positive electrode 11, an electrolyte layer 13 and a negative electrode 12. The positive electrode 11 has a configuration in which positive electrode active material layers 11B are provided on both main surfaces of a positive electrode current collector 11A. The negative electrode 12 has a configuration in which negative electrode active material layers 12B are provided on both main surfaces of a negative electrode current collector 12A.

In this case, the positive electrode active material layer 11B provided on one main surface of the positive electrode current collector 11A of the positive electrode 11, faces the negative electrode active material layer 12B provided on one main surface of the negative electrode current collector 12A of the negative electrode 12 adjacent to the positive electrode 11, through the electrolyte layer 13. Several sets of the positive electrode, the electrolyte layer and the negative electrode arranged in this order are stacked on top of each other. The positive electrode active material layer 11B, the electrolyte layer 13 and the negative electrode active material layer 12B adjacent to each other constitute each single cell layer 14. Namely, the lithium ion secondary battery 1 according to the present embodiment has a constitution in which the plural single cell layers 14 are stacked on top of each other so as to be electrically connected in parallel. Here, the negative electrode current collectors 12A located on the outermost layers of the battery element 10 are each provided with the negative electrode active material layer 12B only on one side thereof.

In addition, insulating layers (not shown in the figure) may be provided on peripheries of the respective single cell layers 14 to isolate the positive electrode current collectors 11A and the negative electrode current collectors 12A adjacent to each other. Such an insulating layer for covering the single cell layer is preferably made from a material that can hold an electrolyte contained in the electrolyte layer and prevent liquid leakage of the electrolyte. In particular, general-purpose plastic such as polypropylene (PP), polyethylene (PE), polyurethane (PUR), polyamide resin (PA), polytetrafluoroethylene (PTFE), polyvinylidene fluoride (PVDF) and polystyrene (PS), may be used. Alternatively, thermoplastic olefin rubber or silicone rubber may also be used.

(Positive Electrode Current Collector and Negative Electrode Current Collector)

The positive electrode current collector 11A and the negative electrode current collector 12A are made from an electrically conductive material such as aluminum, copper and stainless steel (SUS) in a foil state or a mesh state. However, the positive electrode current collector 11A and the negative electrode current collector 12A are not limited to such a material, and may be any conventionally known material available for current collectors for lithium ion secondary batteries. The size of the current collectors may be determined depending on the intended use of the battery. For example, current collectors having large areas are used for a large-size battery for which high energy density is required. The thickness of the current collectors is not particularly limited; however, the thickness is generally approximately in the range from 1 µm to 100 µm. The shape of the current collectors is not particularly limited. The battery element 10 shown in FIG. 6 may use current collecting foils or mesh current collectors (such as expanded grids). The current collecting foils are suitable for use when the thin film alloy as the negative electrode active material is directly formed on the negative electrode current collector 12A by a sputtering method.

The material used for the current collectors is not particularly limited as described above. Examples of the material include metal, and resin in which electrically conductive filler is added to an electrically conductive polymer material or a non-conductive polymer material. Examples of the metal include aluminum, nickel, iron, stainless steel, titanium and copper. In addition, a clad metal of nickel and aluminum, a clad metal of copper and aluminum, or an alloyed material of these metals combined together, is preferably used. A foil in which the metal surface is covered with aluminum may also be used. In particular, aluminum, stainless steel, copper and nickel are preferable in view of electron conductivity, battery action potential, and adhesion of the negative electrode active material to the current collectors by sputtering.

Examples of the electrically conductive polymer material include polyaniline, polypyrrole, polythiophene, polyacetylene, polyparaphenylene, polyphenylene vinylene, polyacrylonitrile and polyoxadiazole. These electrically conductive polymer materials have an advantage in simplification of the manufacturing process and lightness of the current collectors, since these materials have sufficient electric conductivity even if electrically conductive filler is not added thereto.

Examples of the non-conductive polymer material include polyethylene (PE; such as high-density polyethylene (HDPE) and low-density polyethylene (LDPE)), polypropylene (PP), polyethylene terephthalate (PET), polyether nitrile (PEN), polyimide (PI), polyamide imide (PAI), polyamide (PA), polytetrafluoroethylene (PTFE), styrene-butadiene rubber (SBR), polyacrylonitrile (PAN), polymethyl acrylate (PMA), polymethyl methacrylate (PMMA), polyvinyl chloride (PVC), polyvinylidene fluoride (PVDF) and polystyrene (PS). These non-conductive polymer materials have high potential tolerance or solvent tolerance.

The electrically conductive polymer material or the non-conductive polymer material may include electrically conductive filler as necessary. In particular, when the resin serving as a substrate of the current collector only includes a non-conductive polymer, the electrically conductive filler is essential to provide the resin with electric conductivity. The electrically conductive filler is not particularly limited as long as it is a substance having electric conductivity. Examples of the material having high electric conductivity, potential tolerance or lithium ion insulation, include metal and electrically conductive carbon. The metal is not particularly limited; however, the metal is preferably at least one element selected from the group consisting of Ni, Ti, Al, Cu, Pt, Fe, Cr, Sn, Zn, In, Sb and K, or an alloy or metal oxide containing these metals. The electrically conductive carbon is not particularly limited; however, the carbon is preferably at least one material selected from the group consisting of acetylene black, Vulcan (registered trademark), Black Pearls (registered trademark), carbon nanofiber, Ketjenblack (registered trademark), carbon nanotube, carbon nanohorn, carbon nanoballoon and fullerene. The amount of the electrically conductive filler added in the current collectors is not particularly limited as long as it provides the current collectors with sufficient electric conductivity. In general, the amount is approximately in the range from 5% to 35% by mass of the total.

However, the current collectors are not limited to the materials described above, and may be any conventional known material available for current collectors for lithium ion secondary batteries.

(Positive Electrode)

The positive electrode 11 of the lithium ion secondary battery has a configuration in which the positive electrode active material layers 11B are formed on one surface or both surfaces of the positive electrode current collector 11A made from an electrically conductive material such as an aluminum foil, a copper foil, a nickel foil or a stainless. The thickness of the positive electrode current collector is not particularly limited as described above; however, it is generally preferably approximately in the range from 1 µm to 30 µm.

The positive electrode active material layer 11B contains, as a positive electrode active material, any one of, or two or more positive electrode materials capable of absorbing and releasing lithium, and may also contain an electric conducting additive and a binder as necessary. The content ratio of the positive electrode active material, the electric conducting additive and the binder in the positive electrode active material layer, is not particularly limited.

Examples of the positive electrode active material include a lithium-transition metal composite oxide, a lithium-transition metal phosphate compound, a lithium-transition metal sulfated compound, a solid solution series material, a ternary series material, an NiMn series material, an NiCo series material and a spinel-manganese series material.

Examples of the lithium-transition metal composite oxide include $LiMn_2O_4$, $LiCoO_2$, $LiNiO_2$, $Li(Ni, Mn, Co)O_2$, $Li(Li, Ni, Mn, Co)O_2$ and $LiFePO_4$. In addition, an oxide in which part of the transition metal contained in each of these composite oxides is substituted with other elements, may be used. Examples of the solid solution series material include $xLiMO_2 \cdot (1-x)Li_2NO_3$ (wherein $0<x<1$, M represents at least one transition metal element in an average oxidation state of 3+, and N represents at least one transition metal element in an average oxidation state of 4+), and $LiRO_2$—$LiMn_2O_4$ (R represents a transition metal element such as Ni, Mn, Co or Fe).

The ternary series material may be a nickel-cobalt-manganese composite positive electrode material. The spinel Mn series material may be $LiMn_2O_4$. The NiMn series material may be $LiNi_{0.5}Mn_{1.5}O_4$. The NiCo series material may be $Li(NiCo)O_2$. In some cases, two or more positive electrode active materials may be used together. In view of having a higher capacity and better output performance, the lithium-transition metal composite oxide is preferably used for the positive electrode active material.

The particle diameter of the positive electrode active material is not particularly limited; however, it is generally preferably as small as possible. The average particle diameter of the positive electrode active material may be approximately in the range from 1 µm to 30 µm, more preferably approximately in the range from 5 µm to 20 µm, in view of operation efficiency and ease of handling. Of course, positive electrode active materials other than the above-described positive electrode active material may be used. In the case that the active materials require different particle diameters in order to achieve their own appropriate effects, the active materials having different particle diameters may be selected and mixed together so as to optimally function to achieve their own effects. Thus, it is not necessary to equalize the particle diameter of all of the active materials.

The binder is added to bind the active materials to each other or bind the active material to the current collector to maintain the electrode structure. The binder may be thermoplastic resin such as polyvinylidene fluoride (PVDF), polytetrafluoroethylene (PTFE), polyvinyl acetate, polyimide (PI), polyamide (PA), polyvinyl chloride (PVC), polymethyl acrylate (PMA), polymethyl methacrylate (PMMA), polyether nitrile (PEN), polyethylene (PE), polypropylene (PP) or polyacrylonitrile (PAN), thermoset resin such as epoxy resin, polyurethane resin or urea resin, or a rubber material such as styrene-butadiene rubber (SBR).

The electric conducting additive is also referred to as an electric conducting agent added to improve electric conductivity. The electric conducting additive used in the present invention is not particularly limited, an conventionally known agent may be used. Examples of the electric conducting additive include a carbon material such as carbon black (such as acetylene black), graphite or carbon fiber. The addition of the electric conducting additive contributes to effectively establishing an electronic network in the active material layer, and improving output performance and battery reliability derived from improvement in retention of an electrolyte solution.

(Negative Electrode)

The negative electrode 12 has a configuration, as in the case of the positive electrode, in which the negative electrode active material layers 12B are formed on one surface or both surfaces of the negative electrode current collector 12A made from the electrically conductive material as described above.

The negative electrode active material layer 12B contains, as a negative electrode active material, any one of, or two or more negative electrode materials capable of absorbing and releasing lithium, and may also contain the same electric conducting additive and binder as the positive electrode active material as necessary. The content ratio of the negative electrode active material, the electric conducting additive and the binder in the negative electrode active material layer, is not particularly limited.

The lithium ion secondary battery as the electric device according to the present invention includes the negative electrode active material containing, as an essential component, the Si—Ge—Ti series alloy having the above-described composition. As described above, the negative electrode active material layer 12B according to the present embodiment may be a thin film including the Si—Ge—Ti series alloy. In this case, the negative electrode active material layer 12B may consist of the Si—Ge—Ti series alloy, or may further contain a conventionally known negative electrode active material capable of reversibly absorbing and releasing lithium without any particular obstacle.

Alternatively, as described above, the negative electrode active material layer 12B may contain, as a main component, the particles of the Si—Ge—Ti series alloy. In this case, the negative electrode active material 12B may contain the electric conducting additive and the binder, which may be contained also in the positive electrode active material layer 11B, as necessary. Note that, in the present description, "the main component" represents a component contained in the negative electrode active material layer 12B with content of greater than or equal to 50% by mass.

The other negative electrode active material used together may be a carbon material such as graphite that is highly crystalline carbon (such as natural graphite or artificial graphite), low crystalline carbon (such as soft carbon or hard carbon), carbon black (such as Ketjenblack, acetylene black, channel black, lamp black, oil furnace black or thermal black), fullerene, carbon nanotube, carbon nanofiber, carbon nanohorn or carbon fibril. Examples of the negative electrode active material further include a single substance alloyed with lithium such as Si, Ge, Sn, Pb, Al, In, Zn, H, Ca, Sr, Ba, Ru, Rh, Ir, Pd, Pt, Ag, Au, Cd, Hg, Ga, Tl, C, N, Sb, Bi, O, S, Se, Te or Cl, and an oxide and a carbide containing the elements listed above. Examples of the oxide include silicon monoxide (SiO), $SiO_x$ (0<x<2), tin dioxide ($SnO_2$), $SnO_x$ (0<x<2) and $SnSiO_3$. The carbide may be silicon carbide (SiC). Other examples of the negative electrode active material include a metallic material such as a lithium metal, and a lithium-transition metal composite oxide such as a lithium-titanium composite oxide (lithium titanate: $Li_4Ti_5O_{12}$). Each of these negative electrode active materials may be used singly, or two or more of these materials may be used together.

Thus, the negative electrode may be obtained in a manner such that slurry containing the negative electrode active material together with the electric conducting additive and the binder, is applied to the surface of the negative electrode current collector to form the negative electrode active material layer. Alternatively, the negative electrode may be obtained in a manner such that the thin film of the negative electrode active material alloy is directly formed on the surface of the negative electrode current collector by the multi PVD method or the multi CVD method.

As described above, the positive electrode active material layer and the negative electrode active material layer are each provided on one side or both sides of the respective current collectors. Alternatively, one current collector may be provided with the positive electrode active material layer on one side, and provided with the negative electrode active material layer on the other side. Electrodes having such a configuration may be used for a bipolar battery.

(Electrolyte Layer)

The electrolyte layer 13 contains a non-aqueous electrolyte that functions as a carrier of lithium ions that move between the positive electrode and the negative electrode at the time of charging and discharging. The thickness of the electrolyte layer 13 is preferably reduced as much as possible. The thickness is generally approximately in the range from 1 μm to 100 μm, preferably in the range from 5 μm to 50 μm.

The non-aqueous electrolyte contained in the electrolyte layer 13 is not particularly limited as long as it functions as a carrier lithium ions, and may be a liquid electrolyte or a polymer electrolyte.

The liquid electrolyte has a constitution in which lithium salts (electrolyte salts) are dissolved in an organic solvent. The organic solvent may be carbonate such as ethylene carbonate (EC), propylene carbonate (PC), butylene carbonate (BC), vinylene carbonate (VC), dimethyl carbonate (DMC), diethyl, carbonate (DEC), ethyl methyl carbonate (EMC) or methyl propyl carbonate (MPC). The lithium salts may be a compound that can be added to the electrode active material layers, such as $Li(CF_3SO_2)_2N$, $Li(C_2F_5SO_2)_2N$, $LiPF_6$, $LiBF_4$, $LiAsF_6$, $LiTaF_6$, $LiClO_4$ and $LiCF_3SO_3$.

The polymer electrolyte is classified into two types; a gel polymer electrolyte (a gel electrolyte) containing an electrolysis solution, and an intrinsic polymer electrolyte not containing an electrolysis solution. The gel polymer electrolyte preferably has a constitution in which the liquid electrolyte is poured into a matrix polymer (a host polymer) including an ion conductive polymer. The use of the gel polymer electrolyte decreases fluidity of the electrolyte so as to easily interrupt ion conduction between the respective layers.

The ion conductive polymer used as the matrix polymer (the host polymer) is not particularly limited, and examples thereof include polyethylene oxide (PEO), polypropylene oxide (PPO), polyvinylidene fluoride (PVDF), a copolymer of polyvinylidene fluoride and hexafluoropropylene (PVDF-HFP), polyethylene glycol (PEG), polyacrylonitrile (PAN), polymethyl methacrylate (PMMA), and a copolymer of these compounds.

The ion conductive polymer may be the same as or different from an ion conductive polymer used as the electrolyte in the active material layers, but it is preferably the same. The electrolysis solution (namely, the lithium salts and the organic solvent) is not particularly limited, and may employ the electrolyte salts such as lithium salts and the organic solvent such as carbonate as described above.

The intrinsic polymer electrolyte has a constitution in which lithium salts are dissolved in the matrix polymer, but no organic solvent is contained. Thus, the use of the intrinsic polymer electrolyte contributes to reducing the risk of liquid leakage from the battery and thereby enhancing the reliability of the battery.

The matrix polymer of the gel polymer electrolyte or the intrinsic polymer electrolyte can exhibit high mechanical strength when a cross-linked structure is formed. The cross-linked structure may be formed in a manner such that a polymerizable polymer used for polymer electrolyte formation (for example, PEG or PPO) is subjected to polymerization by use of an appropriate polymerization initiator. Examples of the polymerization include thermal polymerization, ultraviolet polymerization, radiation polymerization and electron beam polymerization. The non-aqueous electrolyte contained in the electrolyte layer 13 may be used singly, or two or more kinds thereof may be mixed.

A separator is preferably used in the electrolyte layer 13 when the electrolyte layer 13 contains the liquid electrolyte or the gel polymer electrolyte. The specific configuration of the separator may be a microporous film made from polyolefin such as polyethylene or polypropylene.

(Battery Configuration)

The lithium ion secondary battery has a structure in which the battery element is housed in a battery case (a packing body) such as a can body or a laminated container. The battery element (the electrode structure) has a configuration in which the positive electrode and the negative electrode are connected to each other via the electrolyte layer. The lithium ion secondary battery is mainly classified into two types: a wound type battery including a battery element in which positive electrodes, electrolyte layers and negative electrodes are wound, and a stacking type battery including a battery element in which positive electrodes, electrolyte layers and negative electrodes are stacked. The bipolar battery described above corresponds to the stacking type battery. The lithium ion secondary battery is also referred to as a coin cell, a button battery or a laminated battery depending on the shape and structure of the battery case.

EXAMPLE

Hereinafter, the present invention is explained in more detail with reference to examples; however, the present invention is not limited to these examples.

[1] Preparation of Negative Electrode

As a sputtering apparatus, an independently controllable ternary DC magnetron sputtering apparatus (manufactured by Yamato-Kiki Industrial Co., Ltd.; combinatorial sputter coating apparatus; gun-sample distance: about 100 mm) was used. Thin films of negative electrode active material alloys having compositions according to the respective examples were each formed on a current collector substrate made of a nickel foil having a thickness of 20 µm under the following conditions. Accordingly, 31 negative electrode samples were obtained (Preparation Conditions)

(1) Targets (manufactured by Kojundo Chemical Laboratory Co., Ltd.; purity: 4N)

Si: diameter of 50.8 mm; thickness of 3 mm (backing plate of oxygen-free copper with thickness of 2 mm)

Ge: diameter of 50.8 mm; thickness of 3 mm (backing plate of oxygen-free copper with thickness of 2 mm)

Ti: diameter of 50.8 mm; thickness of 5 mm (2) Conditions of Film Formation

Base pressure: up to $7 \times 10^{-6}$ Pa

Sputtering gas: Ar (99.9999% or more)

Sputtering gas introduction amount: 10 sccm

Sputtering pressure: 30 mTorr

DC power source: Si (185 W), Ge (0 to 120 W), Ti (0 to 150 W)

Pre-sputtering time: 1 min.

Sputtering time: 10 min.

Substrate temperature: room temperature

In each example, the Si target, the Ge target and the Ti target were used, the sputtering time was fixed at 10 minutes, and the power levels of the DC power source were changed for each target within the above-described ranges. Then, alloyed thin films in an amorphous state were formed on Ni substrates, so as to obtain negative electrode samples including the alloyed thin films having various compositions. Table 1 and FIG. 1 to FIG. 5 show the element compositions of these alloyed thin films.

As for the sample preparation, for example, in Example 14, the DC power source 1 (Si target) was set to 185 W, the DC power source 2 (Ge target) was set to 100 W, and the DC power source 3 (Ti target) was set to 130 W. In Comparative Example 2, the DC power source 1 (Si target) was set to 185 W, the DC power source 2 (Ge target) was set to 100 W, and the DC power source 3 (Ti target) was set to 0 W. In Comparative Example 9, the DC power source 1 (Si target) was set to 185 W, the DC power source 2 (Ge target) was set to 0 W, and the DC power source 3 (Ti target) was set to 40 W.

The obtained alloyed thin films were analyzed by using the following analysis method and analysis device:

(Analysis Method)

Composition analysis: SEM-EDX analysis (manufactured by JEOL Ltd.), EPMA analysis (manufactured by JEOL Ltd.)

Film thickness measurement (for calculating sputtering rate): film thickness meter (manufactured by Tokyo Instruments, Inc.)

Film state analysis: Raman spectroscopic analysis (manufactured by Bruker Japan Co., Ltd.)

[2] Preparation of Batteries

Each negative electrode sample obtained as described above was placed to face the counter electrode made of a lithium foil via a separator, and an electrolysis solution was poured therein, so as to prepare a CR2032 type coin cell prescribed in IEC60086 for each example. The lithium foil was a lithium foil (manufactured by Honjo Metal Co., Ltd.) cut out in a manner as to have a diameter of 15 mm and a thickness of 200 µm. The separator was Celgard 2400 (manufactured by Celgard, LLC.). The electrolysis solution used was prepared in a manner such that $LiPF_6$ (lithium hexafluorophosphate) was dissolved, at a concentration of 1 M, into a mixed non-aqueous solvent in which ethylene carbonate (EC) and diethyl carbonate (DEC) were mixed in a ratio of 1:1.

[3] Charge-Discharge Test of Batteries

The following charge-discharge test was performed on the respective cells obtained as described above. That is, the respective cells were charged and discharged by using a charge-discharge tester in a thermoset bath set at 300 K (27° C.). The charge-discharge tester used was HJ0501SM8A (manufactured by Hokuto Denko Corporation), and the thermostat bath used was PFU-3K (manufactured by ESPEC Corp.). Each cell was charged at 0.1 mA from 2 V to 10 mV at the constant current/constant voltage mode during charging, that is, in the process of Li intercalation to the negative electrode for evaluation. After that, each cell was discharged at 0.1 mA from 10 mV to 2 V at the constant current mode during discharge, that is, in the process of Li release from the negative electrode. This charge-discharge procedure is regarded as a single charge-discharge cycle. The charge-discharge test was carried out by repeating the above-described charge-discharge cycle 100 times. Then, the discharge capacity maintenance ratios at the 50th cycle and at the 100th cycle with respect to the 1st cycle were each analyzed. Table 1 shows the results thus obtained. The charge-discharging capacity was calculated per alloy weight. Note that, in Table 1, "discharging capacity maintenance ratio (%)" represents a ratio of the discharging capacity at the 50th cycle or at the 100th cycle to the discharging capacity at the 1st cycle. Namely, "discharging capacity maintenance ratio (%)" is calculated by ((discharging capacity at 50th cycle or at 100th cycle)/(discharging capacity at 1st cycle)×100).

TABLE 1

| Classification | Negative Electrode Active Material Component (%) | | | Discharge Capacity At 1st Cycle (mAh/g) | Discharge Capacity Maintenance Ratio (%) | | Note |
| --- | --- | --- | --- | --- | --- | --- | --- |
| | Si | Ge | Ti | | At 50th Cycle | At 100th Cycle | |
| Example 1 | 50 | 3 | 47 | 1700 | 88 | 50 | Si—Ge—Ti Series |
| Example 2 | 31 | 40 | 29 | 1228 | 87 | 40 | |
| Example 3 | 21 | 54 | 25 | 932 | 83 | 40 | |
| Example 4 | 19 | 50 | 31 | 858 | 93 | 42 | |
| Example 5 | 17 | 63 | 20 | 749 | 90 | 44 | |
| Example 6 | 27 | 35 | 38 | 1197 | 84 | 45 | |
| Example 7 | 24 | 32 | 44 | 1086 | 96 | 50 | |
| Example 8 | 50 | 16 | 34 | 2143 | 84 | 42 | |
| Example 9 | 46 | 15 | 39 | 2016 | 88 | 47 | |
| Example 10 | 39 | 13 | 48 | 1726 | 83 | 48 | |
| Example 11 | 37 | 12 | 51 | 1507 | 93 | 54 | |
| Example 12 | 34 | 11 | 55 | 1426 | 91 | 51 | |
| Example 13 | 33 | 10 | 57 | 1314 | 93 | 53 | |
| Example 14 | 30 | 10 | 60 | 1248 | 94 | 53 | |
| Example 15 | 29 | 9 | 62 | 1149 | 93 | 55 | |
| Example 16 | 27 | 9 | 64 | 1068 | 94 | 53 | |
| Example 17 | 25 | 8 | 67 | 982 | 95 | 50 | |
| Example 18 | 24 | 8 | 68 | 876 | 93 | 53 | |
| Comparative Example 1 | 100 | 0 | 0 | 3232 | 47 | 16 | Pure Si |
| Comparative Example 2 | 93 | 7 | 0 | 3827 | 60 | 38 | S—Ge Series |
| Comparative Example 3 | 48 | 52 | 0 | 2062 | 41 | 26 | |
| Comparative Example 4 | 39 | 61 | 0 | 1732 | 34 | 22 | |
| Comparative Example 5 | 33 | 67 | 0 | 1460 | 26 | 16 | |
| Comparative Example 6 | 28 | 72 | 0 | 1277 | 30 | 18 | |
| Comparative Example 7 | 0 | 100 | 0 | 1348 | 80 | 37 | Pure Ge |
| Comparative Example 8 | 90 | 0 | 10 | 3218 | 82 | 36 | Si—Ti Series |
| Comparative Example 9 | 77 | 0 | 23 | 2685 | 82 | 39 | |
| Comparative Example 10 | 68 | 0 | 32 | 2398 | 82 | 39 | |
| Comparative Example 11 | 60 | 0 | 40 | 2041 | 83 | 37 | |
| Corparative Example 12 | 54 | 0 | 46 | 1784 | 83 | 32 | |
| Comparative Example 13 | 49 | 0 | 51 | 1703 | 75 | 24 | |

As is apparent from Table 1, the batteries of Examples 1 to 18 each including the negative electrode active material containing Si with content in the range from greater than or equal to 17% by mass to less than 90% by mass, Ti with content in the range from 10% by mass to 83% by mass exclusive, and Ge with content in the range from 0% by mass to 73% by mass exclusive, have the initial capacity of greater than or equal to 749 mAh/g. Further, these batteries of the respective examples showed the discharge capacity maintenance ratios of 83% or higher at the 50th cycle, and 40% or higher even at the 100th cycle. Thus, in view of ensuring a higher capacity and improved cycle durability, the negative electrode active material according to the present invention preferably includes the alloy containing Si with content in the range from greater than or equal to 17% by mass to less than 90% by mass, Ti with content in the range from 10% by mass to 83% by mass exclusive, and Ge with content in the range from 0% by mass to 73% by mass exclusive. In contrast, the batteries of Comparative Examples 1 to 13 showed the discharge capacity maintenance ratios that are significantly decreased compared with the batteries of Examples even though the discharge capacities at the 1st cycle are relatively high. Accordingly, the test revealed that the batteries including the negative electrode active material containing the respective components within the specified ranges according to the present invention can achieve a high capacity and improved cycle durability.

The entire contents of Japanese Patent Application No. P2011-116710 (filed on May 25, 2011) is herein incorporated by reference.

Although the present invention has been described above by reference to the examples, the present invention is not limited to the descriptions thereof, and it will be apparent to those skilled in the art that various modifications and improvements can be made.

The lithium ion secondary battery is exemplified as an electric device in the present embodiment and the examples; however, the present invention is not limited to the lithium ion secondary battery and is applicable to secondary batteries of other types and, further, to primary batteries. In addition, the present invention is applicable not only to the batteries but also to capacitors. In other words, the negative electrode for an electric device and the electric device according to the present invention are only required to contain a predetermined alloy as a negative electrode active material, and other constitution requirements are not particularly limited.

The present invention is also applicable to button type batteries and can type batteries, in addition to the laminated battery described above. Further, the present invention is applicable not only to stacking type (flat-shaped) batteries but also to wound type (cylinder-shaped) batteries. In terms of electrical connection inside the lithium ion secondary battery, the present invention is applicable not only to internal parallel connection-type batteries as described above but also to internal serial connection-type batteries such as bipolar batteries. Note that, in general, a battery element in a bipolar battery has a constitution in which bipolar electrodes, each provided with a negative electrode active material layer on one side of a current collector and a positive electrode active material layer on the other side of the current collector, and electrolyte layers, are stacked on top of each other.

INDUSTRIAL APPLICABILITY

The present invention uses, as the negative electrode active material for an electric device, the Si—Ge—Ti series ternary alloy. Accordingly, the electric device such as a lithium ion secondary battery employing the negative electrode active material, contributes to achieving long cycle life and ensuring a high capacity and improved cycle durability.

REFERENCE SIGNS LIST

1 Lithium ion secondary battery
10 Battery element
11 Positive electrode
11A Positive electrode current collector
11B Positive electrode active material layer
12 Negative electrode
12A Negative electrode current collector
12B Negative electrode active material layer
13 Electrolyte layer
14 Single cell layer
21 Positive electrode tab
22 Negative electrode tab
30 Exterior body

The invention claimed is:

1. A negative electrode active material for an electric device, comprising an alloy containing Si in a range from 17% by mass to 46% by mass inclusive, Ti in a range from greater than or equal to 51% by mass to less than or equal to 68% by mass, Ge in a range from 3% by mass to 32% by mass inclusive, and inevitable impurities as a residue,
wherein the negative electrode active material is capable of suppressing an amorphous to crystalline phase transition when the Si is alloyed with Li.

2. The negative electrode active material for an electric device according to claim 1, wherein the alloy contains Si in a range from greater than or equal to 27% by mass to less than or equal to 37% by mass, Ti in a range from greater than or equal to 51% by mass to less than or equal to 64% by mass, and Ge in a range from greater than or equal to 9% by mass to less than or equal to 12% by mass.

3. The negative electrode active material for an electric device according to claim 1, wherein the alloy contains Si in a range from greater than or equal to 27% by mass to less than or equal to 33% by mass, Ti in a range from greater than or equal to 57% by mass to less than or equal to 64% by mass, and Ge in a range from greater than or equal to 9% by mass to less than or equal to 10% by mass.

4. A negative electrode for an electric device, comprising the negative electrode active material according to claim 1.

5. An electric device comprising the negative electrode active material according to claim 1.

6. The electric device according to claim 5 that is a lithium ion secondary battery.

7. The electric device according to claim 5, wherein a discharge capacity maintenance ratio is 91% or higher at a 50th cycle or is 50% or higher at a 100th cycle.

8. The electric device according to claim 7, wherein an initial capacity is 876 mAh/g or higher.

9. A negative electrode for an electric device, comprising:
a negative electrode active material for said electric device, comprising an alloy containing Si in a range from 17% by mass to 50% by mass inclusive, Ti in a range from 20% by mass to 68% by mass inclusive, Ge in a range from 3% by mass to 63% by mass inclusive, and inevitable impurities as a residue,
wherein the negative electrode active material is capable of suppressing an amorphous to crystalline phase transition when the Si is alloyed with Li.

10. An electric device comprising the negative electrode according to claim 9.

11. The electric device according to claim 10, wherein a discharge capacity maintenance ratio is 83% or higher at a 50th cycle or is 40% or higher at a 100th cycle.

12. The electric device according to claim 11, wherein an initial capacity is 749 mAh/g or higher.

13. A negative electrode active material for an electric device, comprising an alloy containing Si in a range from 24% by mass to 37% by mass inclusive, Ti in a range from 51% by mass to 68% by mass inclusive, Ge in a range from 8% by mass to 12% by mass inclusive, and inevitable impurities as a residue,
wherein the negative electrode active material is capable of suppressing an amorphous to crystalline phase transition when the Si is alloyed with Li.

14. A negative electrode for an electric device comprising:
the negative electrode active material of claim 13.

15. An electric device comprising the negative electrode active material according to claim 13, wherein a discharge capacity maintenance ratio is 91% or higher at a 50th cycle or is 50% or higher at a 100th cycle.

16. The electric device according to claim 15, wherein an initial capacity is 876 mAh/g or higher.

* * * * *